United States Patent
Kim et al.

(10) Patent No.: US 8,368,299 B2
(45) Date of Patent: Feb. 5, 2013

(54) ORGANIC LIGHT EMITTING DIODE DISPLAY

(75) Inventors: Eun-Ah Kim, Yongin (KR); Woo-Suk Jung, Yongin (KR); Hee-Seong Jeong, Yongin (KR); Soon-Ryong Park, Yongin (KR); Joo-Hwa Lee, Yongin (KR); Noh-Min Kwak, Yongin (KR); Chul-Woo Jeong, Yongin (KR); Hee-Chul Jeon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 218 days.

(21) Appl. No.: 12/534,811

(22) Filed: Aug. 3, 2009

(65) Prior Publication Data

US 2010/0033087 A1    Feb. 11, 2010

(30) Foreign Application Priority Data

Aug. 5, 2008  (KR) .................. 10-2008-0076440
Jan. 7, 2009  (KR) .................. 10-2009-0001161

(51) Int. Cl.
*H01L 51/52* (2006.01)
(52) U.S. Cl. .............. 313/506; 313/112; 313/504
(58) Field of Classification Search .......... 257/40, 257/72, 98–100, 642–643, 759; 313/498–512, 313/110–117; 315/169.1, 169.3; 427/58, 427/64, 66, 532–535, 539; 428/690–691, 428/917; 438/26–29, 34, 82, 455; 445/24–25
See application file for complete search history.

(56) References Cited

U.S. PATENT DOCUMENTS

| | | | | |
|---|---|---|---|---|
| 6,117,529 | A  * | 9/2000 | Leising et al. | 428/209 |
| 6,565,231 | B1 * | 5/2003 | Cok | 362/653 |
| 2002/0135312 | A1 * | 9/2002 | Koyama | 315/169.3 |
| 2003/0098645 | A1 * | 5/2003 | Lee et al. | 313/504 |
| 2003/0127656 | A1 | 7/2003 | Aizawa et al. | |
| 2004/0000865 | A1 * | 1/2004 | Yamazaki | 313/506 |
| 2004/0198129 | A1 * | 10/2004 | Chang et al. | 445/24 |
| 2004/0207321 | A1 * | 10/2004 | Nishikawa et al. | 313/506 |
| 2005/0146266 | A1 * | 7/2005 | Kuma et al. | 313/506 |
| 2006/0088951 | A1 * | 4/2006 | Hayashi et al. | 438/99 |
| 2006/0290271 | A1 * | 12/2006 | Cok | 313/504 |
| 2007/0040495 | A1 * | 2/2007 | Ahn | 313/506 |

(Continued)

FOREIGN PATENT DOCUMENTS

JP  2004-094236  3/2004
JP  2004-311305  11/2004

(Continued)

OTHER PUBLICATIONS

European Search Report dated Jun. 14, 2012, for corresponding European Patent application 09167245.1, (7 pages).

*Primary Examiner* — Mariceli Santiago
*Assistant Examiner* — Donald Raleigh
(74) *Attorney, Agent, or Firm* — Christie, Parker & Hale, LLP

(57) ABSTRACT

An organic light emitting diode (OLED) display including a substrate, a thin film transistor (TFT) formed on the substrate, an OLED, a colored polarizing member on the OLED, and a colored material on the OLED and having a color that is different from that of the polarizing member. The OLED includes a pixel electrode, an organic emission layer on the pixel electrode, and a common electrode on the organic emission layer, wherein the pixel electrode is coupled to the TFT.

18 Claims, 6 Drawing Sheets

U.S. PATENT DOCUMENTS

| | | |
|---|---|---|
| 2007/0257609 A1 | 11/2007 | Fukuda et al. |
| 2008/0150421 A1* | 6/2008 | Takata ............................ 313/504 |
| 2008/0241989 A1* | 10/2008 | Cok et al. ......................... 438/99 |
| 2008/0277666 A1* | 11/2008 | Jeon et al. ........................ 257/66 |

FOREIGN PATENT DOCUMENTS

| | | |
|---|---|---|
| JP | 2007-188052 A | 7/2007 |
| JP | 2007-294404 | 11/2007 |
| JP | 2008-139497 A | 6/2008 |
| KR | 10-2003-0081948 | 10/2003 |
| KR | 10-2004-0073649 | 8/2004 |
| KR | 10-2005-0049688 | 5/2005 |
| KR | 10-2005-0076464 | 7/2005 |
| KR | 10-2006-0030436 | 4/2006 |

* cited by examiner

901

ORGANIC LIGHT EMITTING DIODE DISPLAY

CROSS-REFERENCE TO RELATED APPLICATIONS

This application claims priority to and the benefit of Korean Patent Application Nos. 10-2008-0076440 and 10-2009-0001161 filed in the Korean Intellectual Property Office on Aug. 5, 2008 and Jan. 7, 2009, respectively, the entire contents of which are incorporated herein by reference.

BACKGROUND OF THE INVENTION

1. Field of the Invention

The present invention relates to an organic light emitting diode (OLED) display.

2. Description of the Related Art

An OLED display includes a plurality of OLEDs having a hole injection electrode, an organic emission layer, and an electron injection electrode. Light is emitted by energy generated when excitons, that is, electron-hole pairs, are combined to drop from an excited state to a ground state, and the OLED display displays an image utilizing the emitted light.

Accordingly, the OLED display has self-luminance characteristics, and compared to a liquid crystal display (LCD), the thickness and a weight thereof can be reduced because a separate light source is not required. Further, because the OLED display has high quality characteristics such as low power consumption, high luminance, and high reaction speed, the OLED display is suitable for use in a mobile electronic device.

In general, electrodes and other metal wires of the OLED display can reflect external light. The expression of black and the contrast of the OLED display deteriorate due to reflection of external light, thereby reducing the quality of the display characteristics of the OLED display.

The above information disclosed in this Background section is only for enhancement of understanding of the background of the invention and therefore it may contain information that does not form the prior art that is already known in this country to a person of ordinary skill in the art.

SUMMARY

In one aspect, an exemplary embodiment of the present invention provides an organic light emitting diode (OLED) display that can improve visibility by suppressing the reflection of external light.

An OLED display according to an exemplary embodiment of the present invention includes a substrate, a thin film transistor (TFT) on the substrate, an OLED, a colored polarizing member on the OLED, and a colored material on the OLED and having a chromatic color that is different from that of the polarizing member. The OLED includes a pixel electrode, an organic emission layer on the pixel electrode, and a common electrode on the organic emission layer, wherein the pixel electrode is coupled to the TFT.

In some embodiments, the brightness of a mixture of the color of the polarizing member and the color of the colored material is lower than the brightness of each individual color.

In a further embodiment, the color of the polarizing member and the color of the colored material are in a complementary relationship.

The polarizing member may include a polarization film and a ¼ wavelength phase delay film.

In some embodiments, the OLED display may further include a pixel defining layer on the substrate, the pixel defining layer having an opening that exposes the OLED, wherein the colored material is the pixel defining layer.

In these embodiments, The polarizing member may have a blue-based color, and the pixel defining layer may have a yellow-based or red-based color.

Further, in these embodiments, the pixel defining layer may be made of a material including an acryl-based resin.

The TFT may include a gate electrode, a source electrode, and a drain electrode, may further include a conductive layer formed in the same layer as, and made of the same material as, at least one of the gate electrode, the source electrode, or the drain electrode, and at least a part of the conductive layer may be disposed under the pixel defining layer.

In some embodiments, the OLED display further includes a sealing member on the substrate and covering the TFT and the OLED. The colored material may be the sealing member.

In these embodiments, the polarizing member may have a blue-based color, and the sealing member may have a yellow-based color.

In some embodiments, the OLED display may further include a sealing member on the substrate and covering the TFT and the OLED, and a sealing filling layer between the sealing member and the OLED. The colored material may be the sealing filling layer.

In these embodiments, the polarizing member may have a blue-based color, and the sealing filling layer may have a yellow-based color.

In some embodiments, the OLED display may further include a sealing member on the substrate and covering the TFT and the OLED, and a cover window on the sealing member. The colored material may be the cover window.

In these embodiments, the polarizing member may have a blue-based color, and the cover window may have a yellow-based color.

In some embodiments, the OLED display may further include a sealing member on the substrate and covering the TFT and the OLED, a cover window on the sealing member, and a cover filling layer between the sealing member and the cover window. The colored material may be the cover filling layer.

In these embodiments, the polarizing member may have a blue-based color, and the cover filling layer may have a yellow-based color.

DETAILED DESCRIPTION OF EXEMPLARY EMBODIMENTS

Figure 1:
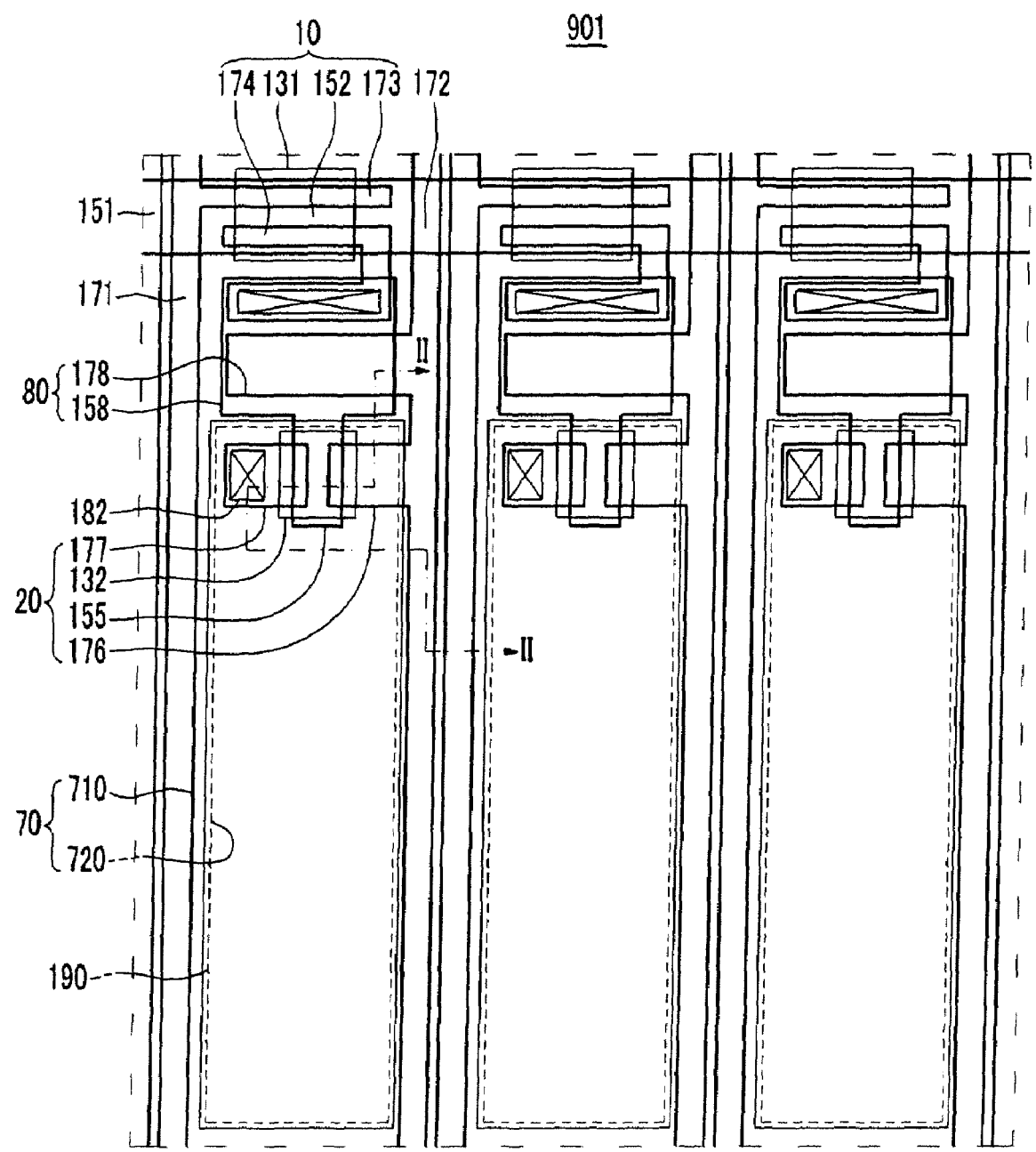
FIG. 1 is a layout view of an organic light emitting diode (OLED) according to a first exemplary embodiment of the present invention.

The present invention will be described more fully hereafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. In addition, the size and the thickness of each element in the drawing are random samples for better understanding and ease of description, and the present invention is not limited thereto. In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, when an element is referred to as being "on" another element, it may be entirely on the other element, or it may be partially on the other element. Like reference numerals designate like elements throughout the specification.

In the several exemplary embodiments, constituent elements having the same configuration are representatively described in a first exemplary embodiment by designating like constituent elements thereto, and other exemplary embodiments will be described only regarding differences from the first exemplary embodiment.

In addition, in the accompanying drawings, an organic light emitting diode (OLED) display is illustrated as an active matrix (AM)-type OLED display in a 2Tr-1Cap structure in which two thin film transistors (TFTs) and one capacitor are formed in one pixel, but the present invention is not limited thereto. Therefore, the OLED display can have various structures. For example, three or more TFTs and two or more capacitors can be provided in one pixel of the OLED display, and separate wires can be further provided in the OLED display.

Here, the term "pixel" refers to a minimum unit for displaying an image, and the OLED display displays an image by using a plurality of pixels.

Hereinafter, a first exemplary embodiment of the present invention will be described with reference to FIG. 1 and FIG. 2.

As shown in FIG. 1, an OLED display 901 according to a first exemplary embodiment of the present invention includes a switching thin film transistor 10, a driving thin film transistor 20, a capacitor 80, and an OLED 70 in each pixel. In addition, the OLED display 901 further includes gate lines 151 extending in one direction, and data lines 171 and common power lines 172 that respectively cross the gate lines 151 to be insulated therefrom. Here, one pixel may be defined by a boundary including a gate line 151, a data line 171, and a common power line 172.

The OLED 70 includes a pixel electrode 710, an organic emission layer 720 formed on the pixel electrode 710, and a common electrode 730 (shown in FIG. 2) formed on the organic emission layer. Here, the pixel electrode 710 is an anode (+), which is a hole injection electrode, and the common electrode 730 is a cathode (−), which is an electron injection electrode. However, the present invention is not limited thereto, and the pixel electrode 710 may be the cathode and the common electrode 730 may be the anode according to a driving method of the OLED display 901. Holes and electrons are respectively injected from the pixel electrode 710 and the common electrode 730 into the organic emission layer 720, and form excitons. When the excitons change from an excited state to a base state, light is emitted.

The switching thin film transistor 10 includes a switching semiconductor layer 131, a switching gate electrode 152, a switching source electrode 173, and a switching drain electrode 174, and the driving thin film transistor 20 includes a driving semiconductor layer 132, a driving gate electrode 155, a driving source electrode 176, and a driving drain electrode 177.

The capacitor 80 includes a first sustain electrode 158 and a second sustain electrode 178 that are disposed with an interlayer insulation layer (160 of FIG. 2) interposed therebetween.

The switching thin film transistor 10 is used as a switch for selecting pixels to emit light. The switching gate electrode 152 is connected to the gate line 151. The switching source electrode 173 is connected to the data line 171. The switching drain electrode 174 is disposed at a distance from the switching source electrode 173, and is connected to the first sustain electrode 158.

The driving thin film transistor 20 applies driving power for light emission of an organic emission layer 720 of an OLED 70 in the selected pixel to the pixel electrode 710. The driving gate electrode 155 is connected to the first sustain electrode 158. The driving source electrode 176 and the second sustain electrode 178 are respectively connected to the common power line 172. The driving drain electrode 177 is connected to the pixel electrode 710 of the OLED 70 through a contact hole 182.

With the above-described structure, the switching thin film transistor 10 is driven to transmit a data voltage applied to the data line 171 to the driving thin film transistor 20 by a gate voltage applied to the gate line 151. A voltage that corresponds to a voltage difference between a common voltage transmitted from the common power line 172 to the driving thin film transistor 20 and the data voltage transmitted through the switching thin film transistor 10 is stored in the capacitor 80, and a current corresponding to the voltage stored in the capacitor 80 flows to the OLED 70 through the driving thin film transistor 20 so that OLED 70 emits light.

Figure 2:
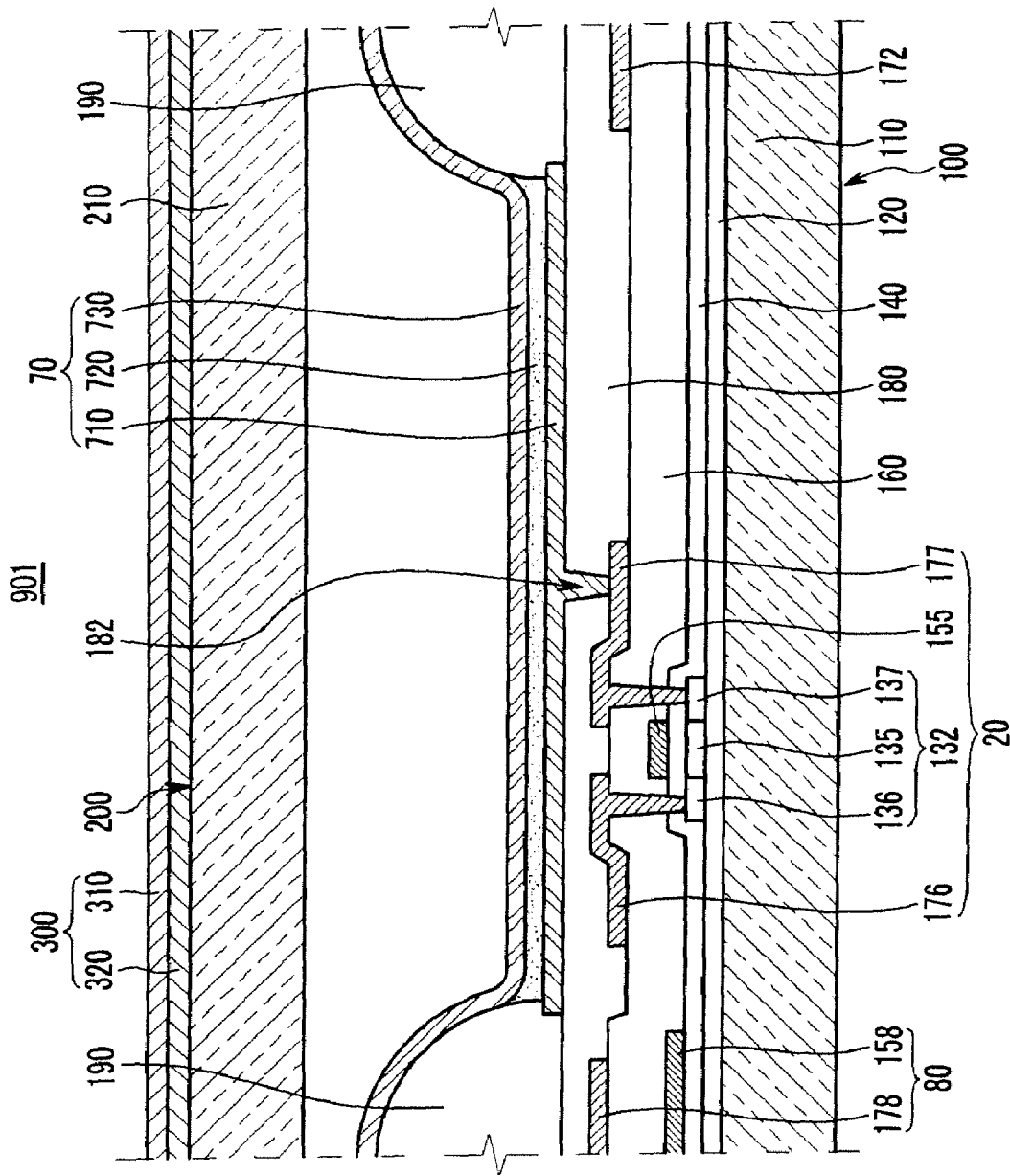
FIG. 2 is a cross-sectional view of FIG. 1, taken along the line II-II.

In addition, the OLED display 901 further includes a polarizing member 300 and a sealing member 200 in addition to a display substrate 100 having the OLED 70 as shown in FIG. 2.

The polarizing member 300 is disposed on the OLED 70. The polarizing member 300 causes destructive interference of external light to reduce or extinguish it. That is, the polarizing member 300 suppresses reflection of external light. However, the polarizing member 300 does not cancel light of all wavelengths, and therefore reflection of external light is not adequately suppressed with only the polarizing member 300. In addition, the polarizing member 300 has a color.

The sealing member 200 covers to seal from the outside and to protect the thin film transistors 10 and 20 and the OLED 70 formed on a substrate 110. In some embodiments, an insulation substrate 210 made of a material such as glass or plastic is used as the sealing member 200. In addition, the sealing member 200 also has a color.

In FIG. 2, the polarizing member 300 is disposed on an external surface of the sealing member 200. However, the present invention is not limited thereto, and the polarizing member 200 may be disposed at an inner space covered by the sealing member 200.

In addition, the polarizing member 300 and the sealing member 200 have different colors. That is, the polarizing member 300 and the sealing member 200 are adapted such that they transmit light having differing dominant wavelengths, or different chromatic colors. In some embodiments, the sealing member 200 has a color that causes the entire brightness of the emitted light to decrease when the color is mixed with a color of the polarizing member 300. That is, when the color of the polarizing member 300 and the color of the sealing member 200 are mixed, brightness of the mixture is lower than for each on their own.

In a further exemplary embodiment, the sealing member 200 has a color that is in a complementary relationship with the color of the polarizing member 300. That is, a color of the sealing member 200 and a color of the polarizing member 300 respectively have a hue that complements the other in a fashion known to those skilled in the art.

With the above-described configuration, the OLED display 901 can have improved visibility by suppressing reflection of external light.

In further detail, reflection of external light incident on the electrodes 710 and 730 of the OLED 70 or other metal wires is primarily suppressed by the polarizing member 300, and then secondarily suppressed by the colors of the sealing member 200 and the polarizing member 300. That is, since the brightness of light passing through the sealing member 200 and the polarizing member 300 is reduced by a color difference therebetween, the sealing member 200 can suppress reflection of external light together with the polarizing member 300. Particularly, when the sealing member 200 and the polarizing member 300 are in a complementary color relationship, a mixture of the two colors is close to black so that most or all wavelengths of light have a reduced intensity. Accordingly, reflection of the external light can be more efficiently suppressed.

For example, the polarizing member 300 may have a blue-based color and the sealing member 200 may have a yellow-based color. In this case, the sealing member 200 functions as a yellow color filter so that yellow light passes through the sealing member 200. In addition, since brightness of the yellow light is significantly reduced while being passed through the polarizing member 300 having the blue-based color, reflection of the external light to the electrodes 710 and 730 of the OLED 70 and other metal wires can be suppressed. However, the present invention is not limited thereto. Therefore, the polarizing member 300 and the sealing member 200 may respectively have various colors that are mixed subtractively.

Hereinafter, a structure of the OLED display 901 according to the first exemplary embodiment of the present invention will be described with reference to FIG. 2. FIG. 2 shows a cross-sectional view of the OLED display 901 taken along the line II-II in FIG. 1, focusing on the driving thin film transistor 20, the OLED 70, and the capacitor 80.

A structure of a thin film transistor according to an exemplary embodiment of the invention will now be described in further detail with reference to the driving thin film transistor 20. In addition, in describing the switching thin film transistor 10, only differences with the driving thin film transistor 20 will be provided.

The substrate 110 in this embodiment is formed of an insulating material such as glass, ceramic, or plastic. However, embodiments of the present invention are not limited thereto. Therefore, the substrate 110 may be a conductive metal substrate made of stainless steel and the like.

A buffer layer 120 is formed on the substrate 110. The buffer layer 120 prevents impurities from permeating the substrate 110 and planarizes a surface thereof, and is made of one or more various materials for performing such functions. For example, a silicon nitride (SiNx) layer, a silicon dioxide (SiO2) layer, and/or a silicon oxynitride (SiOxNy) layer can be used as the buffer layer 120. However, the buffer layer 120 is not always necessary, and may be omitted according to the type and process conditions of the substrate 110.

A driving semiconductor layer 132 is formed on the buffer layer 120. The driving semiconductor layer 132 in an exemplary embodiment is formed of a polysilicon layer. In addition, the driving semiconductor layer 132 includes a channel region 135 in which impurities are not doped, and a source region 136 and a drain region 137 that are doped with p+ impurities at respective sides of the channel region 135. In this case, the doped ion material is a P-type impurity such as boron (B), and B2H6 is generally used as the doped ion material. The impurity changes in accordance with the type of thin film transistor.

In the first exemplary embodiment of the present invention, a PMOS-structured thin film transistor using the P-type impurity is used as the driving thin film transistor 20, but one skilled in the art would comprehend that the invention is not limited thereto. Therefore, a NMOS-structured thin film transistor or a CMOS-structured thin film transistor can be used as the driving thin film transistor 20.

In addition, although the driving thin film transistor 20 of the exemplary embodiment illustrated in FIG. 2 is a polycrystalline thin film transistor including a polysilicon layer, the switching thin film transistor 10 (not shown in FIG. 2) may be a polycrystalline thin film transistor or an amorphous thin film transistor including an amorphous silicon layer.

A gate insulation layer 140 made of silicon nitride (SiNx) or silicon dioxide (SiO2) is formed on the driving semiconductor layer 132. A gate wire including a driving gate electrode 155 is formed on the gate insulating layer 140. The gate wire further includes the gate line 151 (shown in FIG. 1), a first sustain electrode 158, and other wires. In addition, the driving gate electrode 155 is formed to overlap at least a part of the driving semiconductor layer 132, and particularly, is formed to overlap the channel region 135.

An interlayer insulation layer 160 that covers the driving gate electrode 155 is formed on the gate insulating layer 140. The gate insulating layer 140 and the interlayer insulating layer 160 share through-holes exposing the source region 136 and the drain region 137 of the driving semiconductor layer 132. Like the gate insulating layer 140, in this embodiment the interlayer insulating layer 160 is made of a ceramic-based material such as silicon nitride (SiNx) or silicon dioxide (SiO2).

A data wire including a driving source electrode 176 and a driving drain electrode 177 is formed on the interlayer insulating layer 160. The data wire further includes the data line 171 (shown in FIG. 1), the common power line 172, a second sustain electrode 178, and other wires. In addition, the driving source electrode 176 and the driving drain electrode 177 are respectively connected to the source region 136 and the drain region 137 of the driving semiconductor layer 132 through the through-holes.

As described, the driving thin film transistor 20 including the driving semiconductor layer 132, the driving gate electrode 155, the driving source electrode 176, and the driving drain electrode 177 is formed.

The configuration of the driving thin film transistor 20 is not limited to the above-described embodiment, and can be variously modified with a disclosed configuration that can be realized by a person of ordinary skill in the art.

A planarization layer 180 that covers the data wires 172, 176, 177, and 178 is formed on the interlayer insulating layer 160. The planarization layer 180 removes steps and performs planarization in order to increase luminous efficiency of the OLED 70. In addition, the planarization layer 180 has a contact hole 182 through which the drain electrode 177 is partially exposed.

According to various exemplary embodiments, the planarization layer 180 is made of a polyacrylate resin, an epoxy resin, a phenolic resin, a polyamide resin, a polyimide resin, an unsaturated polyester resin, a polyphenylenether resin, a polyphenylenesulfide resin, and/or benzocyclobutene (BCB).

The pixel electrode 710 of the OLED 70 is formed on the planarization layer 180. The pixel electrode 710 is connected with the drain electrode 177 through the contact hole 182 of the planarization layer 180.

In addition, a pixel defining layer 190 having an opening that exposes the pixel electrode 710 is formed on the planarization layer 180. That is, the pixel electrode 710 is disposed to correspond to the opening of the pixel defining layer 190.

The pixel defining layer 190 may be made of an inorganic material of a resin or silica group such as a polyacrylate resin or a polyimide.

The organic emission layer 720 is formed on the pixel electrode 710 in the opening of the pixel defining layer 190, and the common electrode 730 is formed on the pixel defining layer 190 and the organic emission layer 720.

As such, the OLED 70 including the pixel electrode 710, the organic emission layer 720, and the common electrode 730 is formed.

One or both of the pixel electrode 710 or the common electrode 730 may be formed of a transparent conductive material, and one can be formed of a transflective or reflective conductive material. According to the selection of materials of the pixel electrode 710 and the common electrode 730, the OLED display 901 can be classified as a top light emitting type, a bottom light emitting type, and a dual-side light emitting type. The OLED display 901 according to the present exemplary embodiment includes a reflective pixel electrode 710 and a transparent common electrode 730, and thus is a top light emitting type of OLED display.

For the transparent conductive material, various embodiments use indium tin oxide (ITO), indium zinc oxide (IZO), zinc oxide (ZnO), or indium oxide (In2O3). For the reflective material, various embodiments use lithium (Li), calcium (Ca), lithium fluoride/calcium (LiF/Ca), lithium fluoride/aluminum (LiF/Al), aluminum (Al), silver (Ag), magnesium (Mg), or gold (Au).

In some embodiments, the organic emission layer 720 is made of a low-molecular material or a high-molecular material. Such an organic emission layer 720 is formed in a multi-layer structure including a hole injection layer (HIL), a hole transport layer (HTL), an emission layer, an electron transport layer (ETL), and an electron injection layer (EIL). That is, the HIL is disposed on the pixel electrode 710 which is a positive electrode, and the HTL, the emission layer, the ETL, and the EIL are sequentially stacked thereon.

The sealing member 200 and the polarizing member 300 are disposed on the OLED 70. The sealing member 200 is disposed opposite to the substrate 110 and covers the thin film transistor 20 and the OLED 70.

The polarizing member 300 includes a polarization film 310 and a ¼ wavelength phase delay film 320. The polarization film 310 linearly polarizes light passing therethrough, and the ¼ wavelength phase delay film 320 delays the phase of light passing therethrough by 45 degrees. Here, the linearly-polarized light that passed through the polarization film 310 is circularly polarized while passing through the ¼ wavelength phase delay film 320. The polarization film 310 and the ¼ wavelength phase delay film 320 may be manufactured by methods that are well-known to those skilled in the art.

The polarizing member 300 and the sealing member 200 respectively have colors that are in a complementary color relationship. That is, when the color of the polarizing member 300 and the color of the sealing member 200 are mixed, the entire brightness is decreased.

In the first exemplary embodiment of the present invention, the polarizing member 300 has a blue-based color; that is, it has relatively high transmittance for blue-based light. Accordingly, when the OLED display 901 emits light having a blue-based color with a relatively low efficiency, which is common for OLEDs, utilization of a polarizing member 300 that has a blue-based color may be more efficient. In this case, the sealing member 200 has a yellow-based color.

Therefore, brightness of external light reflected from the electrodes 710 and 730 and other metal wires is decreased since it is subtractively mixed while passing through the sealing member 200 and the polarizing member 300. Here, the reflection of the external light can also be suppressed by the polarizing member 300 itself.

The polarizing member 300 and the sealing member 200 are not limited to the previously described exemplary embodiment, and they may respectively have various colors that are mixed subtractively.

Hereinafter, a second exemplary embodiment of the present invention will be described with reference to FIG. 3.

Figure 3:
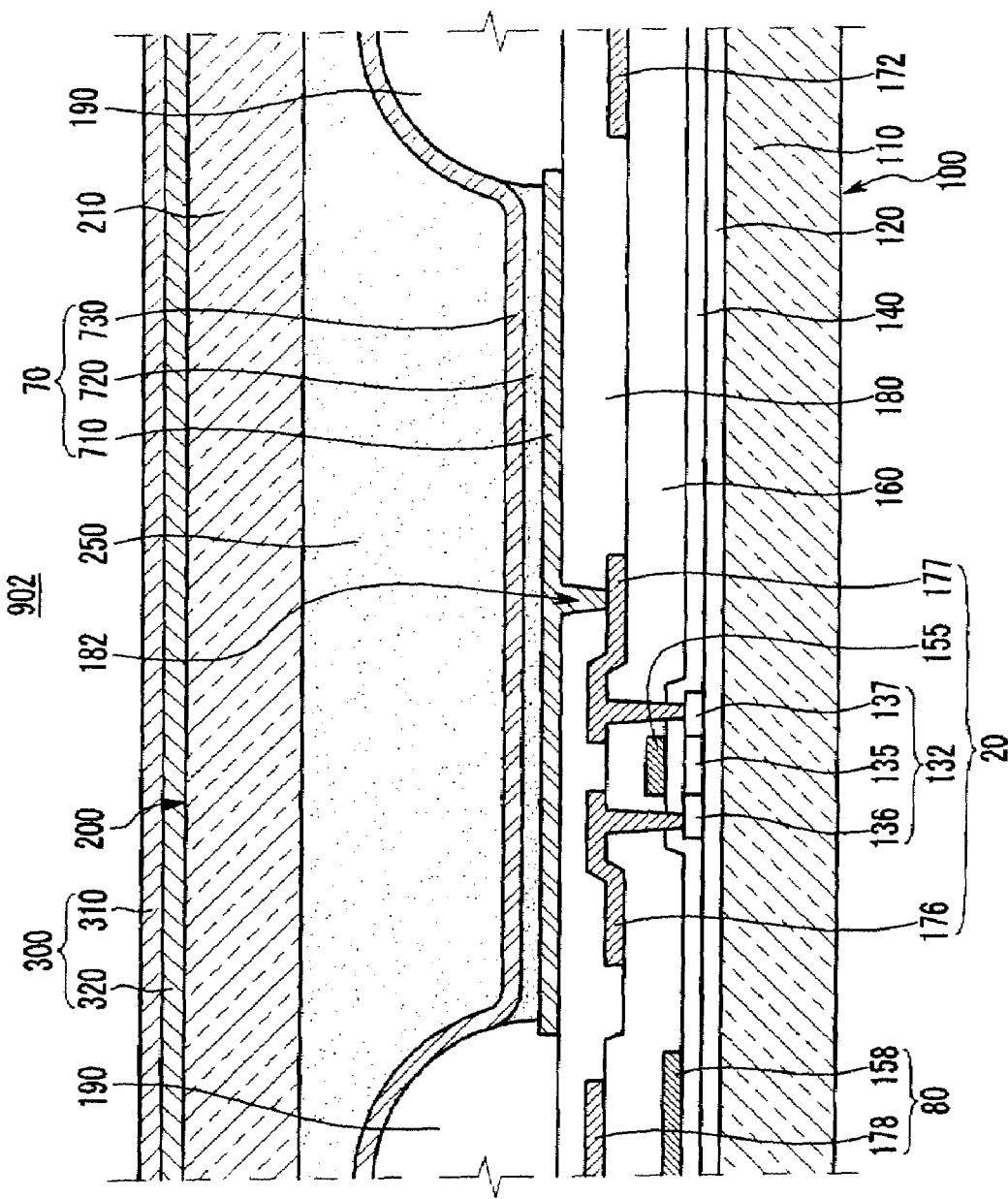
FIG. 3 is a cross-sectional view of an OLED display according to a second exemplary embodiment of the present invention.

As shown in FIG. 3, an OLED display 902 further includes a sealing filling layer 250 filled in a space between an OLED 70 and a sealing member 200. The sealing filling layer 250 stably fixes the sealing member 200, reduces or prevents penetration of moisture and foreign materials into the OLED 70, and reduces reflection of light due to a refractive index difference.

In addition, in this embodiment the sealing filling layer 250 is made of a material including a resin-based material, and has a color. In the OLED display 902 according to the second exemplary embodiment of the present invention, the sealing member 200 substantially does not have a color.

In addition, in this embodiment a polarizing member 300 and the sealing filling layer 250 respectively have different colors. Particularly, the sealing filling layer 250 has a color of which the entire brightness is decreased when mixed with a color of the polarizing member 300. That is, brightness of the mixed color is lower than the brightness of the color of the polarizing member 300 and the brightness of the color of the sealing filling layer 250.

In some embodiments, the sealing filling layer 250 has a color that is in a complementary relationship with a color of the polarizing member. That is, in these embodiments, the sealing filling layer 250 and the polarizing member 300 have colors that are in a complementary color relationship.

With the above-described configuration, the OLED display 902 can have improved visibility by suppressing reflection of external light.

In further detail, reflection of external light reflected from electrodes 710 and 730 of the OLED 70 or other metal wires is primarily suppressed by the polarizing member 300, and is then secondarily suppressed by the colors of the sealing filling layer 250 and the polarizing member 300. That is, since brightness of light passing through the sealing filling layer 250 and the polarizing member 300 is reduced by a color difference therebetween, the sealing filling layer 250 can suppress reflection of external light together with the polarizing member 300. Particularly, when the sealing filling layer 250 and the polarizing member 300 are in the complementary color relationship, a mixture of the two colors is close to black so that light cannot pass therethrough. Accordingly, reflection of the external light can be more efficiently suppressed.

For example, the polarizing member 300 may have a blue-based color and the sealing filling layer 250 may have a yellow-based color. In this case, the sealing filling layer 250 functions as a yellow color filter so that yellow light passes through the sealing filling layer 250. In addition, since brightness of the yellow light is significantly reduced while being passed through the polarizing member 300 having the blue-based color, reflection of the external light to the electrodes 710 and 730 of the OLED 70 and other metal wires can be suppressed. However, the present invention is not limited thereto. Therefore, the polarizing member 300 and the sealing filling layer 250 may respectively have various colors that are mixed subtractively.

Hereinafter, a third exemplary embodiment of the present invention will be described with reference to FIG. 4.

Figure 4:
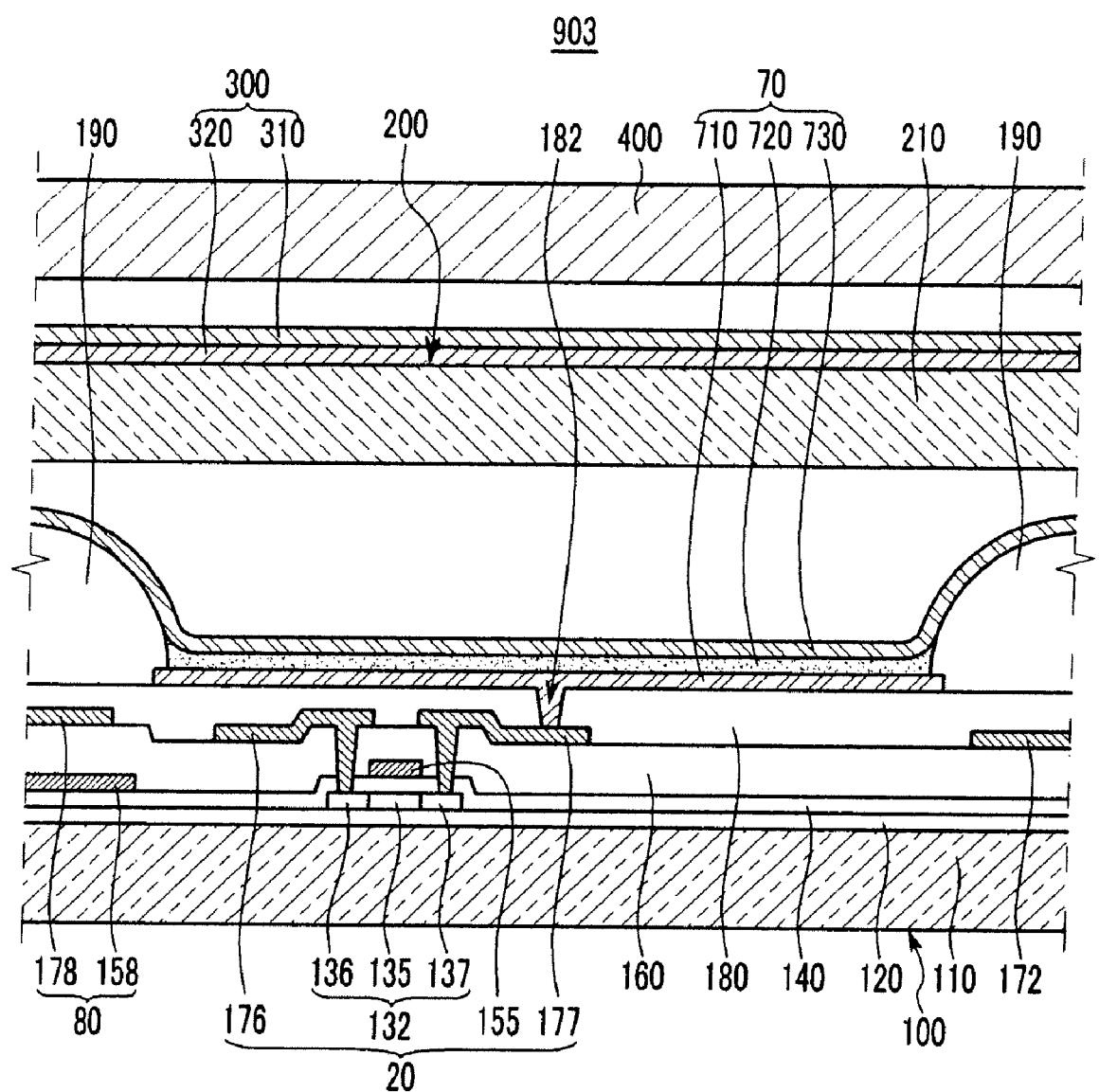
FIG. 4 is a cross-sectional view of an OLED display according to a third exemplary embodiment of the present invention.

As shown in FIG. 4, an OLED display 903 further includes a cover window 400 disposed on a sealing member 200 or on a polarizing member 300. In FIG. 4, the polarizing member 300 is disposed on the sealing member 200, and the cover window 400 is disposed on the polarizing member 300. However, the present invention is not limited thereto. Therefore, the sealing member 200 may be disposed on the polarizing member 300, and the cover window 400 may be disposed on the sealing member 200.

In this embodiment, the cover window 400 is made of a substantially transparent material such as glass or plastic, and has a color. In the OLED display 903 of the third exemplary embodiment of the present invention, the sealing member 200 does not have a color.

In addition, in this embodiment the polarizing member 300 and the cover window 400 have different colors. Particularly, the cover window 400 has a color of which the entire brightness is decreased when the color is mixed with a color of the polarizing member 300. That is, when the color of the polarizing member 300 and the color of the cover window 400 are mixed, the brightness of the mixture is lower than for each on their own.

In some embodiments, the cover window 400 has a color that is in a complementary relationship with the color of the polarizing member 300. That is, in these embodiments, a color of the sealing member 200 and a color of the polarizing member 300 are in a complementary color relationship.

With the above-described configuration, the OLED display 903 can have improved visibility by suppressing reflection of external light.

In further detail, reflection of external light reflected from electrodes 710 and 730 of the OLED 70 or other metal wires is primarily suppressed by the polarizing member 300, and is then secondarily suppressed by colors of the cover window 400 and the polarizing member 300. That is, since brightness of light passing through the cover window 400 and the polarizing member 300 is reduced by a color difference therebetween, the cover window 400 can suppress the reflection of external light together with the polarizing member 300. Particularly, when the cover window 400 and the polarizing member 300 are in the complementary color relationship, a mixture of the two colors is close to black so that light cannot pass therethrough. Accordingly, reflection of the external light can be more efficiently suppressed.

As an example, the polarizing member 300 may have a blue-based color and the cover window 400 may have a yellow-based color. In this case, the cover window 400 functions as a yellow color filter so that yellow light passes through the cover window 400. In addition, since brightness of the yellow light is significantly reduced while being passed through the polarizing member 300 having the blue-based color, reflection of the external light to the electrodes 710 and 730 of the OLED 70 and other metal wires can be suppressed. However, the present invention is not limited thereto. Therefore, the polarizing member 300 and the cover window 400 may respectively have various colors that are mixed subtractively.

Hereinafter, a fourth exemplary embodiment of the present invention will be described with reference to FIG. 5.

Figure 5:
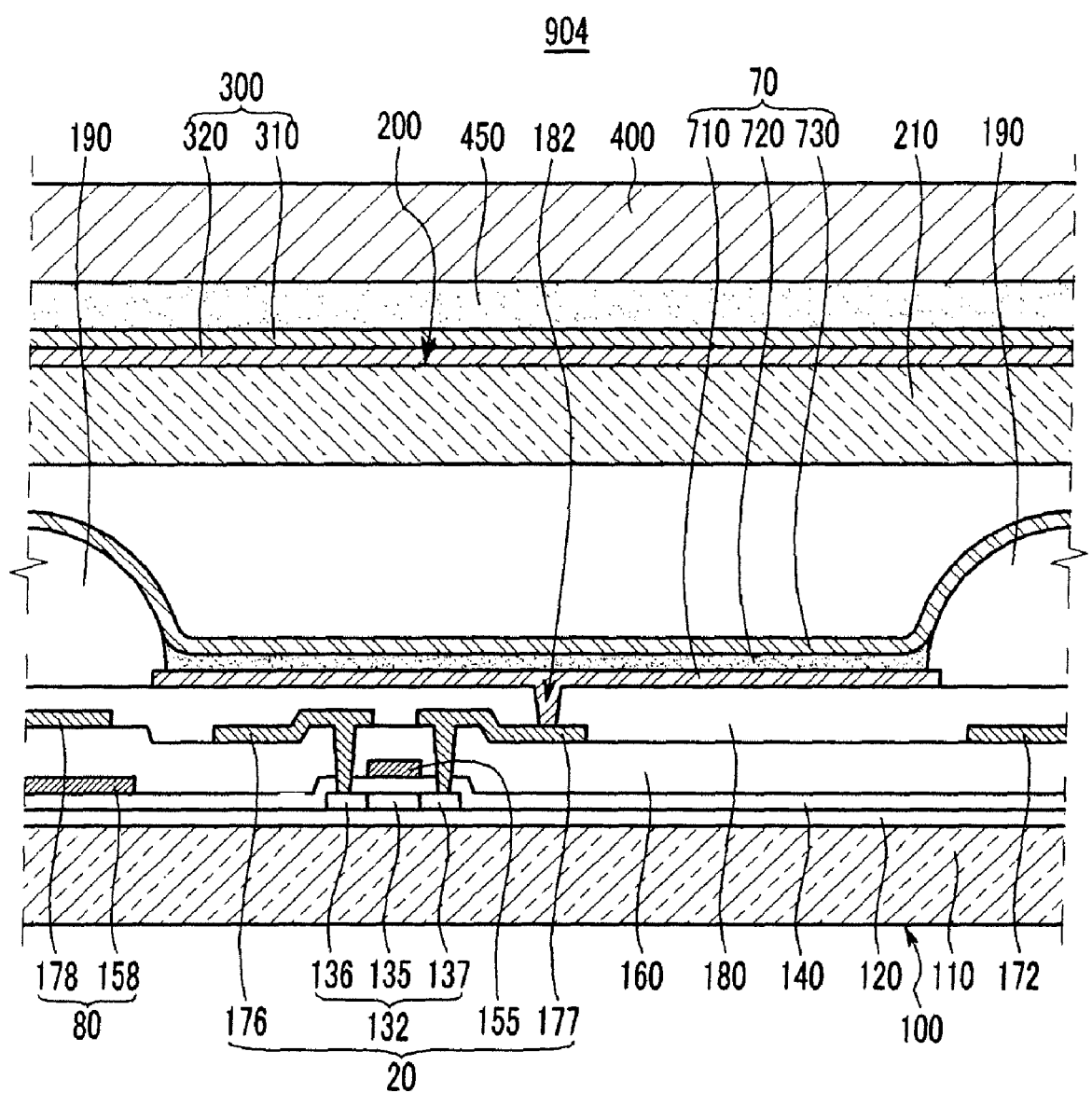
FIG. 5 is a cross-sectional view of an OLED display according to a fourth exemplary embodiment of the present invention.

As shown in FIG. 5, an OLED display 904 further includes a cover window 400 disposed on a polarizing member 300 and a cover filling layer 450 that fills a space between the polarizing member 300 and the cover window 400.

In this embodiment, the cover window 400 is made of a substantially transparent material such as glass or plastic. The cover filling layer 450 stably fixes the cover window 400, reduces reflection of light due to a refractive index difference, and reduces the effect of external impact.

In addition, in this embodiment the cover filling layer 450 is made of a resin-based material, and has a color. In the OLED display 904 of the fourth exemplary embodiment of the present invention, a sealing member 200 does not have a color.

In addition, in this embodiment the polarizing member 300 and the cover filling layer 450 have different colors. Particularly, the cover filling layer 450 has a color of which the entire brightness is decreased when mixed with a color of the polarizing member 300. That is, brightness of the mixed color is lower than the brightness of the color of the polarizing member 300 and the brightness of the color of the sealing filling layer 250.

In some embodiments, the cover filling layer 450 has a color that is in a complementary relationship with a color of the polarizing member. That is, in these embodiments the cover filling member 450 and the polarizing member 300 have colors that are in a complementary color relationship.

With the above-described configuration, the OLED display 904 can have improved visibility by suppressing reflection of external light.

In further detail, reflection of external light reflected to electrodes 710 and 730 of the OLED 70 or other metal wires is primarily suppressed by the polarizing member 300, and is then secondarily suppressed by colors of the cover filling layer 450 and the polarizing member 300. That is, since brightness of light passing through the cover filling layer 450 and the polarizing member 300 is reduced by a color difference therebetween, the cover filling layer 450 can suppress reflection of external light together with the polarizing member 300. Particularly, when the cover filling layer 450 and the polarizing member 300 are in the complementary color relationship, a mixture of the two colors is close to black so that light cannot pass therethrough. Accordingly, reflection of the external light can be more efficiently suppressed.

For example, the polarizing member 300 may have a blue-based color and the cover filling layer 450 may have a yellow-based color. In this case, the cover filling layer 450 functions as a yellow color filter so that yellow light passes through the cover filling layer 450. In addition, since brightness of the yellow light is significantly reduced while being passed through the polarizing member 300 having the blue-based color, reflection of the external light to the electrodes 710 and 730 of the OLED 70 and other metal wires can be suppressed. However, the present invention is not limited thereto. Therefore, the polarizing member 300 and the cover filling layer 450 may respectively have various colors that are mixed subtractively.

Hereinafter, a fifth exemplary embodiment of the present invention will be described with reference to FIG. 6.

Figure 6:
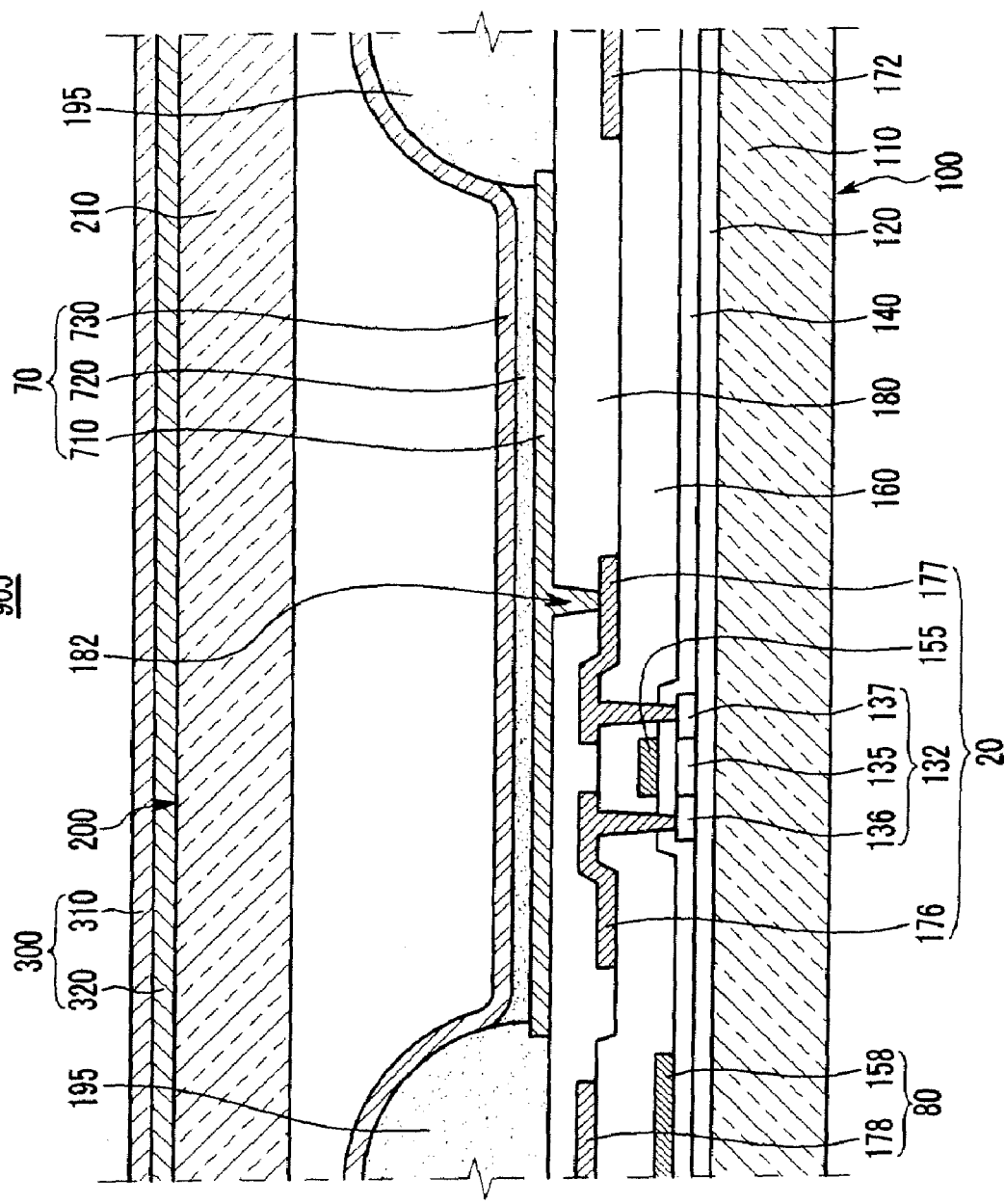
FIG. 6 is a cross-sectional view of an OLED display according to a fifth exemplary embodiment of the present invention.

As shown in FIG. 6, an OLED display 905 includes a pixel defining layer 195 having a color. In this case, the pixel defining layer 195 and a polarizing member 300 have different colors. Particularly, the pixel defining layer 195 has a color of which the entire brightness is decreased when the color is mixed with a color of the polarizing member 300. That is, when the color of the polarizing member 300 and the color of the pixel defining layer 195 are mixed, brightness of the mixture is lower than for each on their own.

In some embodiments, the pixel defining layer 195 has a color that is in a complementary relationship with the color of the polarizing member 300. That is, in these embodiments a color of the pixel defining layer 195 and a color of the polarizing member 300 are in a complementary color relationship.

In the fifth exemplary embodiment of the present invention, a sealing member 200 may not have a color. In FIG. 6, the sealing member 200 does not have a color.

In addition, the OLED display 905 according to the fifth exemplary embodiment of the present invention further includes a conductive layer that is formed in the same layer as at least one of a gate electrode 155, a source electrode 176, a drain electrode 177, and a pixel electrode 710, and is made of the same material as the at least one. At least a part of the conductive layer is disposed under the pixel defining layer 195.

In addition, in the fifth exemplary embodiment of the present invention, the pixel defining layer 195 is made of a material including an acryl-based resin.

With the above-described configuration, the OLED display 905 can have improved visibility by suppressing reflection of external light.

In further detail, in this embodiment reflection of external light reflected to electrodes 710 and 730 of the OLED 70 or other metal wires is primarily suppressed by the polarizing member 300, and is then secondarily suppressed by colors of the pixel defining layer 195 and the polarizing member 300. That is, since brightness of light passing through the pixel defining layer 195 and the polarizing member 300 is reduced by a color difference therebetween, the pixel defining layer 195 can suppress reflection of external light together with the polarizing member 300. Particularly, when the pixel defining layer 195 and the polarizing member 300 are in the complementary color relationship, a mixture of the two colors is close to black so that light cannot pass therethrough. Accordingly, reflection of the external light can be more efficiently suppressed.

For example, the polarizing member 300 may have a blue-based color and the pixel defining layer 195 may have a yellow-based color or a red-based color. When the pixel defining layer 195 is made of an acryl-based resin, the pixel defining layer 195 can easily have a red-based color.

In this embodiment, the polarizing member 300 functions as a blue color filter so that blue light passes through the polarizing member 300. In addition, since brightness of the blue light is decreased while passing through the pixel defining layer 195 having a red-based or yellow-based color, reflection of the external light to the electrodes 710 and 730 of the OLED 70 and other metal wires can be suppressed. However, the present invention is not limited thereto. Therefore, the polarizing member 300 and the pixel defining layer 195 may respectively have various colors that are mixed subtractively.

As previously described in the exemplary embodiments, reflection of external light can be suppressed by a polarizing member 300, and by a mixture of a color of the polarizing member 300 and a color of another colored material. In some embodiments, the polarizing member 300 and the colored material have colors that are in a complementary relationship. In addition, as previously described, the colored material may be one or more of the sealing member 200, the sealing filling layer 250, the cover window 400, the cover filling layer 450, or the pixel defining layer 195.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
   a substrate;
   a thin film transistor (TFT) on the substrate;
   an OLED comprising a pixel electrode, an organic emission layer on the pixel electrode, and a common electrode on the organic emission layer, wherein the pixel electrode is coupled to the TFT;
   a colored polarizing member on the OLED; and
   a colored material on the OLED, the colored material having a chromatic color that is different from a chromatic color of the polarizing member,
   wherein the polarizing member is aligned with the colored material to receive light of a chromatic color that is different from the chromatic color of the polarizing member and
   wherein a mixture of the colors of the colored polarizing member and the colored material is close to black, so that the polarizing member and the colored material are configured to prevent external light from passing therethrough.

2. The OLED display of claim 1, wherein the brightness of a mixture of the color of the polarizing member and the color of the colored material is lower than a brightness of the color of the polarizing member and lower than a brightness of the color of the colored material.

3. The OLED display of claim 2, wherein the color of the polarizing member and the color of the colored material are in a complementary relationship.

4. The OLED display of claim 2, wherein the polarizing member comprises a polarization film and a ¼ wavelength phase delay film.

5. The OLED display of claim 2, further comprising a pixel defining layer on the substrate, the pixel defining layer having an opening that exposes the OLED,
   wherein the colored material is the pixel defining layer.

6. An organic light emitting diode (OLED) display comprising:
   a substrate;
   a thin film transistor (TFT) on the substrate;
   an OLED comprising a pixel electrode coupled to the TFT, an organic emission layer on the pixel electrode, and a common electrode on the organic emission layer;
   a pixel defining layer having an opening that exposes the OLED, the pixel defining layer being a colored material on the OLED and on the substrate; and
   a colored polarizing member on the OLED having a chromatic color that is different from a chromatic color of the pixel defining layer, wherein a brightness of a mixture of the color of the polarizing member and the color of the colored material is lower than a brightness of the color of the polarizing member and lower than a brightness of the color of the colored material, wherein the colored material is the pixel defining layer, and wherein the polarizing member has a blue-based color, and the pixel defining layer has a yellow-based or red-based color.

7. The OLED display of claim 6, wherein the pixel defining layer comprises a material including an acryl-based resin.

8. The OLED display of claim 5, wherein the TFT comprises a gate electrode, a source electrode, and a drain electrode, and further comprises a conductive layer in the same layer as at least one of the gate electrode, the source electrode, or the drain electrode, the conductive layer comprising the same material as the at least one of the gate electrode, the source electrode, or the drain electrode, and wherein at least a part of the conductive layer is under the pixel defining layer.

9. The OLED display of claim 2, further comprising a sealing member on the substrate and covering the TFT and the OLED, wherein the colored material is the sealing member.

10. The OLED display of claim 9, wherein the polarizing member has a blue-based color, and the sealing member has a yellow-based color.

11. The OLED display of claim 2, further comprising a sealing member on the substrate and covering the TFT and the OLED, and a sealing filling layer between the sealing member and the OLED, wherein the colored material is the sealing filling layer.

12. The OLED display of claim 11, wherein the polarizing member has a blue-based color, and the sealing filling layer has a yellow-based color.

13. The OLED display of claim 2, further comprising a sealing member on the substrate and covering the TFT and the OLED, and a cover window on the sealing member, wherein the colored material is the cover window.

14. The OLED display of claim 13, wherein the polarizing member has a blue-based color, and the cover window has a yellow-based color.

15. An organic light emitting diode (OLED) display comprising:

a substrate;

a thin film transistor (TFT) on the substrate;

an OLED comprising a pixel electrode coupled to the TFT, an organic emission layer on the pixel electrode, and a common electrode on the organic emission layer;

a colored polarizing member on the OLED;

a sealing member on the substrate and covering the TFT and the OLED;

a cover window on the sealing member; and a cover filling layer between the sealing member and the cover window, the cover filling layer being a colored material on the OLED and having a chromatic color that is different from a chromatic color of the polarizing member, wherein a mixture of the color of the polarizing member and the color of the colored material is close to black, so that the polarizing member and the colored material are configured to prevent external light from passing therethrough.

16. The OLED display of claim 15, wherein the polarizing member has a blue-based color, and the cover filling layer has a yellow-based color.

17. The OLED display of claim 1, wherein the chromatic color of the colored material on the OLED is uniform throughout the display.

18. The OLED display of claim 17, further comprising a plurality of OLEDs, wherein the colored material covers the plurality of OLEDs.

* * * * *